US006305975B1

(12) United States Patent
Steiner

(10) Patent No.: US 6,305,975 B1
(45) Date of Patent: Oct. 23, 2001

(54) ELECTRICAL CONNECTOR FEEDTHROUGH TO LOW PRESSURE CHAMBER

(75) Inventor: Urs Steiner, Sunnyvale, CA (US)

(73) Assignee: Bear Instruments, Inc., Santa Clara, CA (US)

( * ) Notice: Subject to any disclaimer, the term of this patent is extended or adjusted under 35 U.S.C. 154(b) by 0 days.

(21) Appl. No.: 09/689,995

(22) Filed: Oct. 12, 2000

(51) Int. Cl.$^7$ ................................................. H01R 13/73
(52) U.S. Cl. ............................ 439/559; 439/556; 174/18
(58) Field of Search ................................. 439/559, 556, 439/493; 174/17.08, 18, 17 CT, 65 R, 153 G, 65 G; 361/749, 784, 803

(56) References Cited

U.S. PATENT DOCUMENTS

| | | |
|---|---|---|
| 3,998,515 | 12/1976 | Panek . |
| 4,176,901 | 12/1979 | Ishimaru . |
| 4,231,003 | 10/1980 | Ishimaru .............................. 333/33 |
| 4,262,913 * | 4/1981 | Parfree et al. ........................... 277/1 |
| 4,460,664 | 7/1984 | Jurva et al. ........................... 429/181 |
| 4,607,163 * | 8/1986 | Mizuno ................................. 250/281 |
| 4,717,345 * | 1/1988 | Gorden et al. .......................... 439/67 |
| 4,982,055 | 1/1991 | Pollack et al. ........................ 174/151 |
| 5,015,207 | 5/1991 | Koepke ................................ 439/886 |
| 5,194,697 | 3/1993 | Hegner et al. ........................ 174/151 |
| 5,248,365 | 9/1993 | Kamioka et al. ..................... 156/256 |
| 5,281,767 * | 1/1994 | West et al. ........................... 174/142 |
| 5,406,444 | 4/1995 | Selfried et al. ....................... 361/302 |
| 5,441,107 | 8/1995 | Esser et al. ........................... 165/185 |
| 5,494,101 | 2/1996 | Esser et al. ........................... 165/185 |
| 5,497,828 | 3/1996 | Esser et al. ........................... 165/185 |
| 5,597,066 * | 1/1997 | Burmester ............................. 200/292 |
| 6,003,379 * | 12/1999 | Ichikawa et al. ....................... 73/708 |
| 6,093,886 | 7/2000 | Bazizi et al. ........................ 174/31 R |

* cited by examiner

Primary Examiner—Tulsidas Patel
Assistant Examiner—Son V. Nguyen
(74) Attorney, Agent, or Firm—Townsend and Townsend and Crew LLP; Henry K. Woodward

(57) ABSTRACT

An electrical feedthrough connector to a low pressure (vacuum) chamber such as in a mass spectrometer comprises an epoxy body having at least two generally cylindrical portions with a step between the two generally cylindrical portions and with the portions mating with circular openings in the housing for the low pressure chamber. A step between the two cylindrical portions of the electrically insulating body mates with a step in the opening in the chamber housing with a gasket such as an o-ring placed between the steps to provide a pressure seal. A rigid printed circuit board with electrical components for an interconnect circuit is affixed to one end of the electrically insulating body with a flexible printed circuit connector extending from the rigid printed circuit board through the epoxy body to the low pressure chamber for interconnecting components within the chamber. The flexible printed circuit board is preferably spaced from the rigid printed circuit board and aligned perpendicular to the rigid printed circuit board thereby eliminating any possible leaks.

8 Claims, 4 Drawing Sheets

EXPLODED PERSPECTIVE
VIEW OF FEEDTHROUGH

PERSPECTIVE VIEW
OF WALL OPENING

PERSPECTIVE VIEW
OF FEEDTHROUGH

ELECTRICAL CONNECTOR FEEDTHROUGH TO LOW PRESSURE CHAMBER

BACKGROUND OF THE INVENTION

This invention relates to electrical connector feedthrough as used in electrical and electronic apparatus, and more particularly the invention relates to an electrical connector feedthrough to a low pressure chamber in such apparatus.

Mass spectrometers are well known scientific instruments for analyzing chemical structures. A mass spectrometer includes an ion source, an ion filter, and an ion detector positioned in a low pressure (e.g. vacuum) chamber. Gas at low pressure is introduced into the ion source which ionizes the gas. Ions are then selected by the ion filter and passed to the ion detector. The ion filter selects ions having a particular m/e ratio which may be varied to analyze the gas. Examples of mass spectrometers are described in U.S. Pat. Nos. 5,559,327; 5,389,785; 5,298,745; 4,949,047; 4,885,470; 4,158,771; and 3,757,115.

Electrical connection must be made to contacts within the vacuum chamber to transfer electrical power and electrical signals between components in the chamber such as quadrupoles and ion lenses and circuitry in the ambient atmosphere. To function properly the pressure inside the chamber must be below 10–7 Torr. Typically, multiple different types of electrical signals are required within the same assembly, such as high voltage, high current and shielded signal. More recently vacuum chambers are made out of single block aluminum for cleanliness, disallowing welding. These chambers are also heat cycled for cleanliness, making different thermo expansion become a problem. Traditionally, vacuum feed-through are ceramic-metal brazed pins mounted on metal flanges which in turn are mounted on to the analyzer chamber (U.S. Pat. Nos. 4,176,901/4,231,003), or wired into a flange (U.S. Pat. No. 6,093,886). An alternative to sealed pin technology for the fabrication of cable feedthrough devices entails the use of epoxy materials for the formation of vacuum-tight seals, as described in W. D. Wood and W. L. Wood, "Hermetic Sealing with Epoxy" in Mechanical Engineering, Mar. 1990, Pave Technology Co. This technology, however, is suitable only for devices exposed to temperatures down to about −65° C. Heretofore, Kaplan boards imbedded in plastic have been employed as feedthroughs with a sealant provided on the outer surface of the chamber for pressure sealing the feedthrough. This arrangement is difficult to fabricate and assemble.

The present invention is directed to an improved feedthrough for a low pressure chamber which is easily assembled and replaced, yet effective in sealing the chamber. Further, the feedthrough can be best cycled and permits a common PCB type connector in the assembly.

SUMMARY OF THE INVENTION

In accordance with the invention an electrical feedthrough connector is provided to a low pressure chamber such as in a mass spectrometer where the chamber has a housing with a circular opening having at least two cylindrical openings with two diameters with a step between the two diameters. The connector comprises an electrically insulating body having at least two cylindrical portions which generally mate with the two cylindrical openings in the lower pressure chamber housing and with a step between the two cylindrical portions for mating with the step in the housing opening. A gasket encircles the smaller of the two cylindrical portions of the connector whereby the smaller cylindrical portion is inserted into the cylindrical opening in the chamber housing with the gasket positioned in pressure engagement between the step in the chamber housing opening and the step on the electrical insulating body.

In a preferred embodiment the electrical insulating body comprises an epoxy with electrical connectors extending through the epoxy, such as flexible printed circuit board connectors. The epoxy body is affixed to a printed circuit board having components for the interconnection circuit connected through the connectors to components within the low pressure chamber. In preferred embodiments the gasket comprises an o-ring, and a second o-ring is positioned around the epoxy body and abutting the printed circuit board. The electrical feedthrough connector is readily manufactured, assembled, and disassembled in application.

The invention and objects and features thereof will be more readily apparent from the following detailed description and appended claims when taken with the drawing.

BRIEF DESCRIPTION OF THE DRAWING

Like elements in the several views have the same reference numerals.

DETAILED DESCRIPTION OF ILLUSTRATIVE EMBODIMENT

Figure 1:
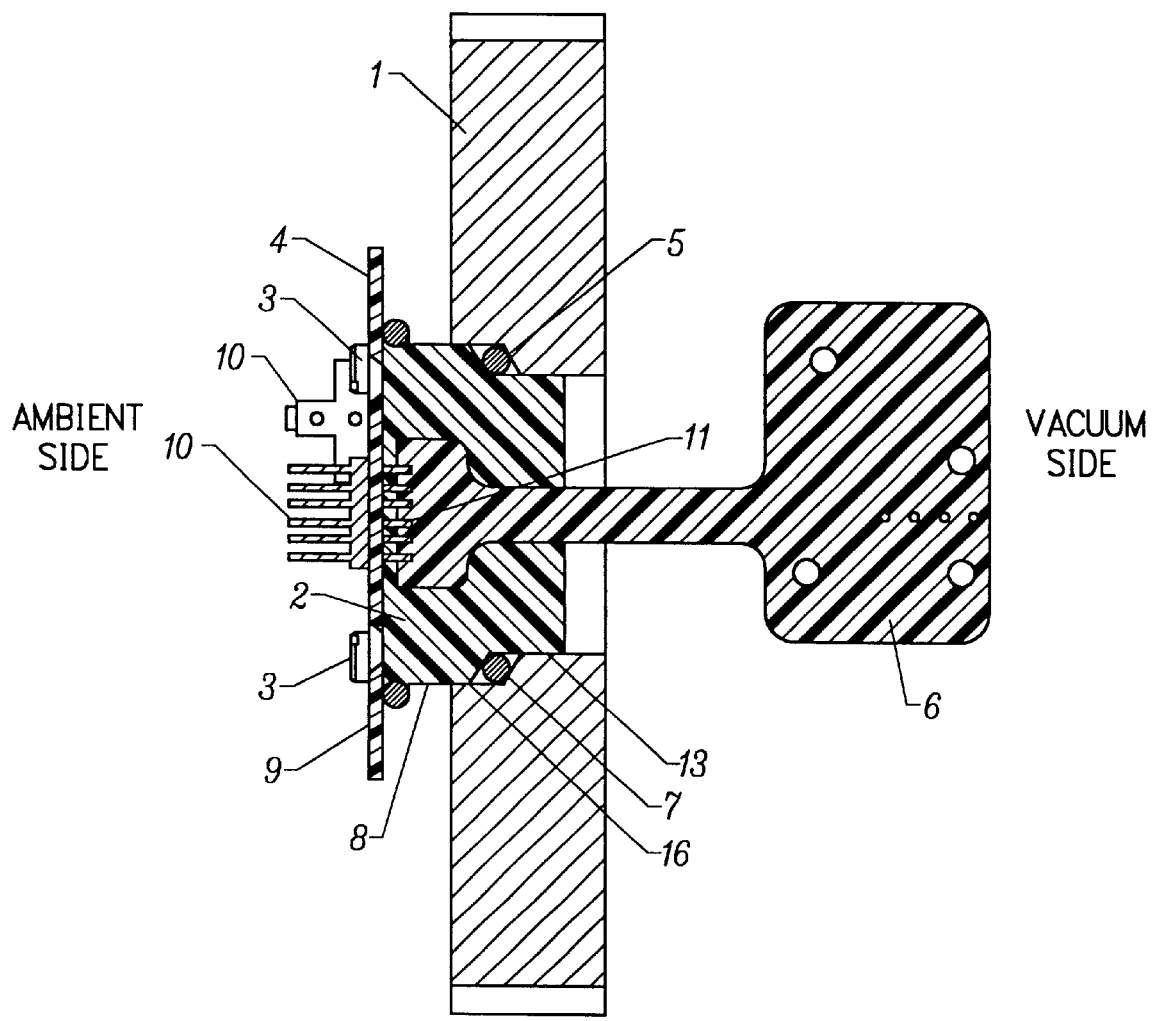
FIG. 1 is a section view of an electrical feedthrough connector in accordance with one embodiment of the invention assembled in an opening through a low pressure chamber housing.
Figure 2:
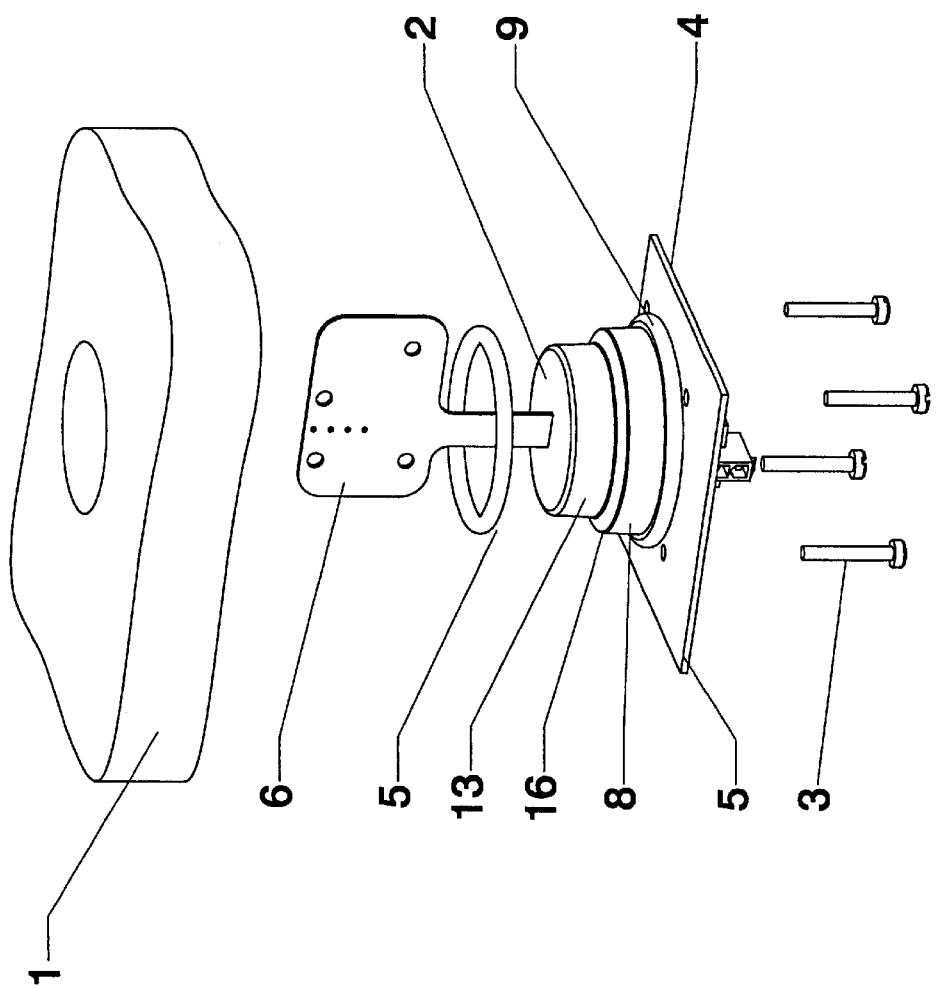
FIG. 2 is an exploded perspective view of the electrical feedthrough connector of FIG. 1.
Figure 3:
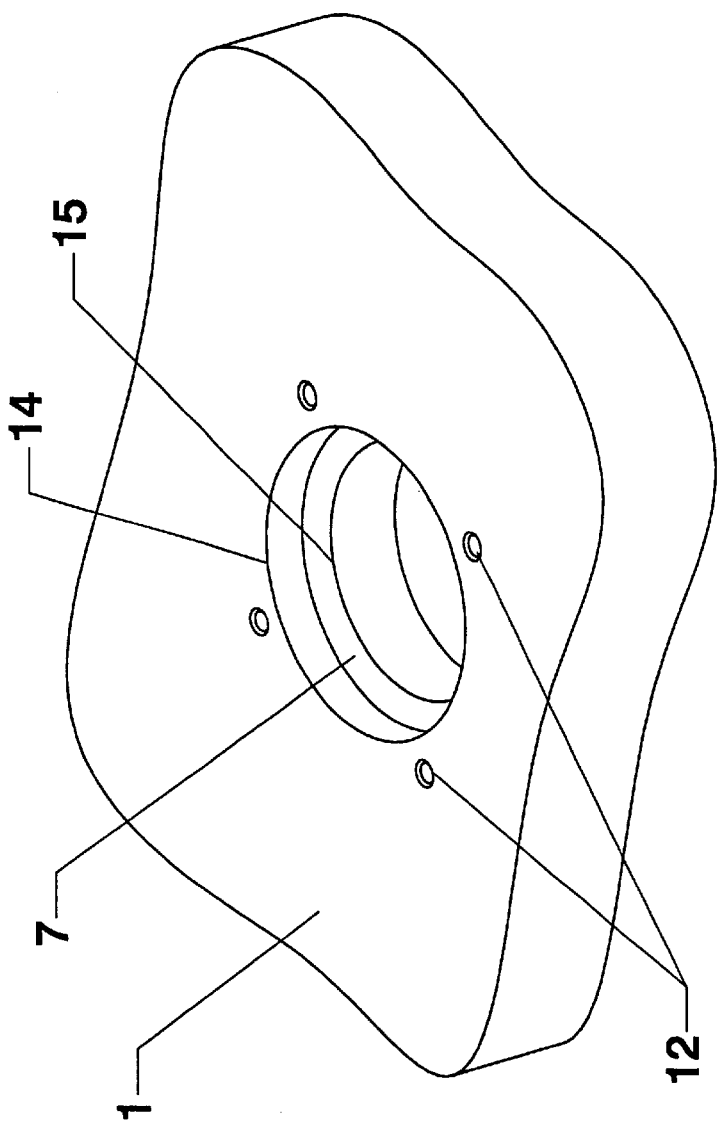
FIG. 3 is a perspective view of the mating chamber opening.
Figure 4:
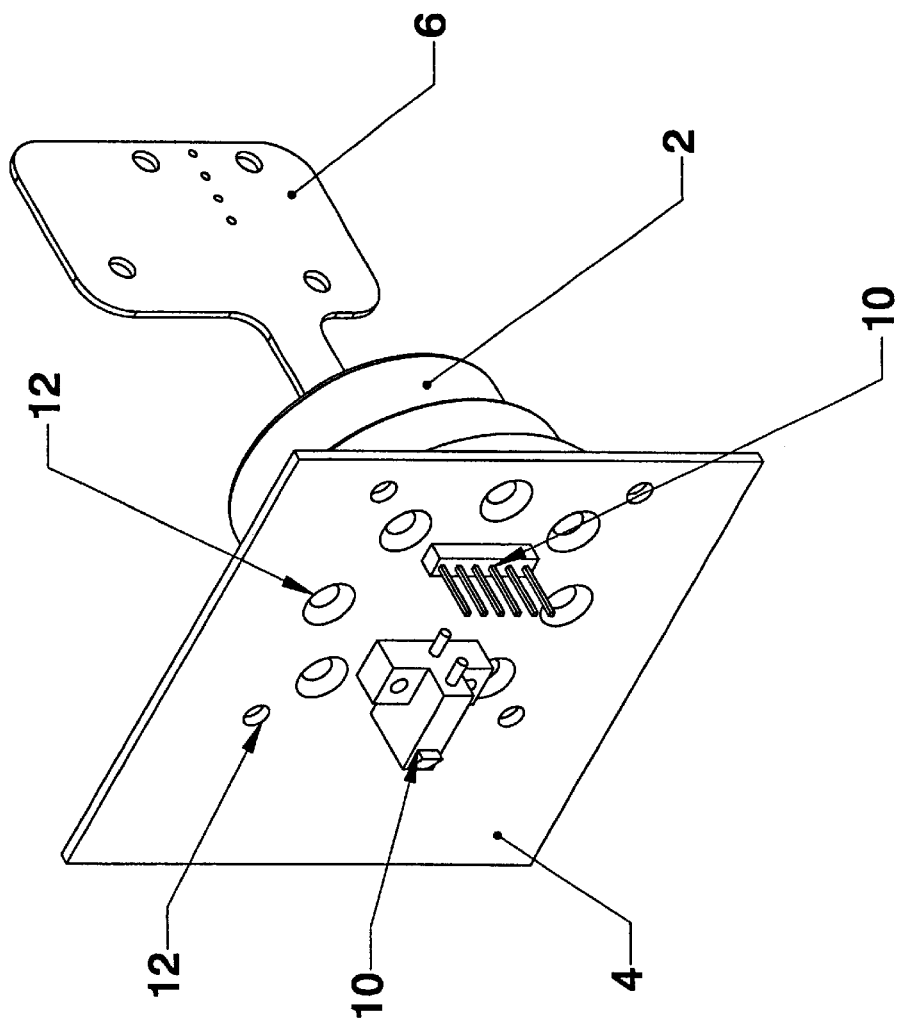
FIG. 4 is a perspective view of the assembled electrical feedthrough of FIGS. 1 and 2.

Referring now to the drawings, FIG. 1 is a section view, FIG. 2 is an exploded perspective view, and FIG. 4 is an assembled perspective view of an electrical feedthrough connector to a low pressure chamber in accordance with one embodiment of the invention. The chamber housing wall 1 receives the electrical connector feedthrough in an opening illustrated in FIG. 3 including a first cylindrical portion 15 having a first diameter and a second cylindrical portion 14 having a second diameter larger than the first diameter with a step 7 in the opening between the two cylindrical portions. The electrical connector feedthrough includes an epoxy feedthrough body 2 having a first cylindrical portion 8 of a first diameter and a second cylindrical portion 13 of a second diameter which mate respectively with the first cylindrical opening 14 and the second cylindrical opening 15 in housing wall 1 with step 7 between the cylindrical portions 14,15 mating with step 16 in the connector. A gasket 5 such as an o-ring is positioned between steps 7,16 for providing an air tight seal.

In this embodiment epoxy feedthrough body 2 is molded onto a printed circuit board 4, and an o-ring 9 is provided between the printed circuit board and the outer surface of chamber housing wall 1. A plurality of components are mounted on the printed circuit board for the interconnect circuitry including PCB connectors 10. The printed circuit board and connector are affixed to housing wall 1 by means of screws 3 extending through rigid printed circuit board 4 and into holes 12 in the chamber wall 1.

The connector is readily fabricated using a mold in which an epoxy such as Epotec™ is poured. The mold is sprayed with a Teflon release agent to facilitate removal of the cured epoxy. The flexible printed circuit board is soldered to the rigid printed circuit board. The assembly is then inserted into the mold with the rigid printed circuit board covering the larger end of the mold. O-ring 9 is used for the seal of the uncured epoxy. The uncured epoxy is then poured into the mold and cured according to the epoxy manufacturer's specifications. Preferably, the flexible printed circuit board is spaced slightly from the rigid printed circuit board with solder wires connecting the flexible PCB 6 to the connector 10 on the rigid PCB 4. This creates an epoxy barrier, thereby eliminating any possible leak through the feedthrough.

The feedthrough connector in accordance with the invention provides an effective seal and is readily assembled and disassembled from the pressure chamber wall. The connector can withstand hot and cold cycles and is ideal for multisignals and high voltage. While the opening in the housing is described as cylindrical, the opening can have a slight taper and the epoxy body of the connector can have a slight taper to facilitate insertion and removal. Thus, while the invention has been described with reference to a specific embodiment, the description is illustrative of the invention and is not to be construed as limiting the invention. For example, a plurality of steps can be provided in the housing opening and on the electrical connector to accommodate a plurality of o-rings or gaskets. Thus, various modifications and applications may occur to those skilled in the art without departing from the true spirit and scope of the invention as defined by the appended claims.

What is claimed is:

1. An electrical feedthrough connector to a low pressure chamber, said chamber being within a housing having a circular opening with at least two generally cylindrical opening portions of different diameters and a step between the two opening portions, said connector comprising:

an electrically insulating body having at least two generally cylindrical body portions with a step between the two cylindrical body portions, and a gasket comprising an o-ring encircling the smaller of the two generally cylindrical body portions whereby a smaller body portion is inserted into the opening with the gasket positioned in pressure engagement between the step in the opening and the step on the electrically insulating body, wherein the electrically insulating body comprises an epoxy with electrical connectors comprising a flexible printed circuit connector extending through the epoxy, the epoxy body being affixed to a rigid printed circuit board having components for an interconnection circuit, the flexible printed circuit connector being spaced from the rigid printed circuit board with epoxy therebetween, and an o-ring positioned around the epoxy body and abutting the printed circuit board to provide a seal for uncured epoxy during fabrication.

2. The electrical feedthrough connector as defined by claim 1 wherein the flexible printed circuit connector is aligned perpendicular to the rigid printed circuit board.

3. The electrical feedthrough connector as defined by claim 1 wherein the low pressure chamber is in a mass spectrometer.

4. An electrical feedthrough connector to a low pressure chamber, said chamber being within a housing having a circular opening with at least two generally cylindrical opening portions of different diameters and a step between the two opening portions, said connector comprising:

an electrically insulating body having at least two generally cylindrical body portions with a step between the two cylindrical body portions, and a gasket comprising an o-ring encircling the smaller of the two generally cylindrical body portions whereby a smaller body portion is inserted into the opening with the gasket positioned in pressure engagement between the step in the opening and the step on the electrically insulating body, wherein the electrically insulating body comprises an epoxy with electrical connectors comprising a flexible printed circuit connector extending through the epoxy, the epoxy body being affixed to a rigid printed circuit board having components for an interconnection circuit, and including an o-ring positioned around the epoxy body and abutting the printed circuit board to provide a seal for uncured epoxy during fabrication.

5. The electrical feedthrough connector as defined by claim 4 wherein the flexible printed circuit connector is spaced from the rigid printed circuit board with epoxy therebetween.

6. The electrical feedthrough connector as defined by claim 4 wherein the epoxy body is affixed to a printed circuit board having components for an interconnection circuit.

7. The electrical feedthrough connector as defined by claim 4 wherein the low pressure chamber is in a mass spectrometer.

8. The electrical feedthrough connector as defined by claim 4 and further including fasteners for fastening the electrically insulating body to the housing.

* * * * *